United States Patent [19]
Frodsham

[11] Patent Number: 5,483,188
[45] Date of Patent: Jan. 9, 1996

[54] GIL EDGE RATE CONTROL CIRCUIT

[75] Inventor: Tim Frodsham, Portland, Oreg.

[73] Assignee: Intel Corporation, Santa Clara, Calif.

[21] Appl. No.: 312,646

[22] Filed: Sep. 27, 1994

[51] Int. Cl.$^6$ .............................. H03K 5/12; H03K 17/04
[52] U.S. Cl. ......................... 327/170; 327/108; 327/376; 327/377; 327/380
[58] Field of Search .......................... 327/108, 376–377, 327/170, 380

[56] References Cited

U.S. PATENT DOCUMENTS

| | | | |
|---|---|---|---|
| 4,150,438 | 4/1979 | Dorey et al. | 364/900 |
| 5,109,166 | 4/1992 | Coburn et al. | 327/170 |
| 5,170,073 | 12/1992 | Hahn et al. | 327/108 |
| 5,343,222 | 8/1994 | Saito et al. | 346/76 |
| 5,347,177 | 9/1994 | Lipp | 307/443 |
| 5,355,391 | 10/1994 | Horowitz et al. | 375/36 |

OTHER PUBLICATIONS

Popescu et al., "The Metaflow Architecture," IEEE Micro, pp. 10–13 and 63–73, Jun. 1991.

*Primary Examiner*—Margaret Rose Wambach
*Attorney, Agent, or Firm*—Blakely, Sokoloff, Taylor & Zafman

[57] ABSTRACT

A GTL phased-output driver is provided which employs a pre-driver, a set of phasing elements or delay elements, and a set of output transistors. The pre-driver includes pull up devices, such as PMOS devices, and pull down devices, such as NMOS devices. The PMOS devices of the pre-driver are configured to route output transistor-triggering signals through the phasing elements in one direction whereas the NMOS devices are configured to route output transistor-releasing signals through the phasing devices in an opposite direction. Output transistors of differing sizes are employed. During a pull down operation, controlled by the PMOS pre-driver transistors, the output transistors are triggered sequentially in order from smallest to largest. During a pull up phase, controlled by the NMOS pre-driver transistors, the output transistors are released in a reverse order from largest to smallest. Hence, the largest transistor is triggered first during a pull down phase but is released last during a pull up phase. Within this configuration, improved edge rates and system noise levels are achieved. An edge rate control circuit is also described wherein time delays provided by each of the phasing elements may be varied to thereby vary the triggering times of the output transistors to also vary the edge rate of the output signal. Test circuitry for allowing individual testing of the output transistors is also described.

42 Claims, 9 Drawing Sheets

GIL EDGE RATE CONTROL CIRCUIT

BACKGROUND OF THE INVENTION

1. Field of the Invention

The invention generally relates to computer bus systems and in particular to a method and apparatus for controlling edge rates of signals driven onto a computer bus herein referred to as a transmission line.

2. Description of Related Art

To achieve the fastest possible bus transmission rates within modern computer systems it is necessary to provide the fastest possible switching rates between logic low and logic high signals while also minimizing noise and other factors which can affect the ability to detect signals. As far as switching rates are concerned, it is desirable to provide the fastest possible edge rate. By edge rate, it is meant the rate at which the voltage level of the bus signal is pulled up from a logic low voltage level to a high voltage level or vice versa. Depending upon the implementation, an edge rate of about 1 volt per nanosecond is desirable. However, the faster the switching rate, the more likely ringing and other noise affects will result. Indeed, a sharp transition from either a high to a low or from a low to a high signal level will result in substantial ringing requiring a considerable settling time. Settling time limits the ability to reliably detect the signal level, thereby limiting how quickly successive transitions can be asserted which in turn limits the data transfer rate. In many systems the fastest overall transmission rates are achieved with a tradeoff between fast edge rate transitions and overall system noise.

One technique for achieving an adequate compromise between fast edge rates and low noise is to provide a phased output driver for driving the bus transmission line wherein several separate output transistors are sequentially activated, perhaps over a period of one or two nanoseconds, to achieve a fairly smooth transition between low and high signal states. Hence, whereas a single output transistor may be capable of achieving the fastest possible signal transition, the system noise as a result of the resulting sharp transition prevents an overall high data transmission rate. By providing several output transistors which are sequentially triggered, the slope of the rising or falling edge of the signal is smoothed out to minimize ringing and other noise caused by a sharp transition while still achieving a relatively fast overall signal transition.

Figure 1:
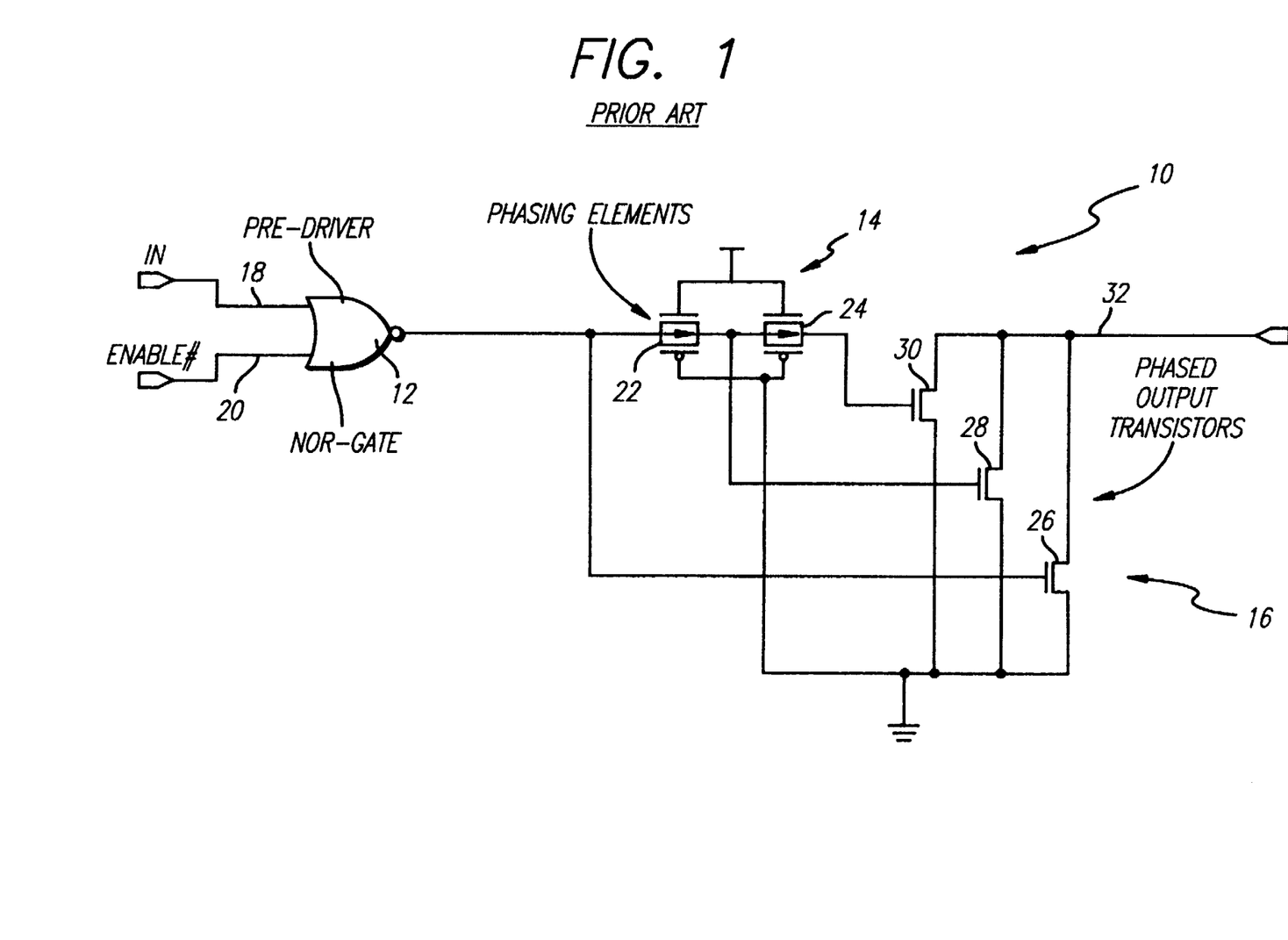
FIG. 1 is a circuit schematic of a phased-output driver configured in accordance with prior art.

An example of a phased output driver is illustrated in FIG. 1. The phased output driver of FIG. 1 is employed within a bus system using Gunning Transceiver Logic (GTL) wherein individual drivers pull down the signal level on the bus. A passive pull up resistor, not illustrated in FIG. 1, is provided on the bus transmission line for pulling up the signal level once the line has been released by the phased output drive.

More specifically, FIG. 1 illustrates a GTL phased output driver 10 having a NOR-gate pre-driver 12, a set of phasing or delay elements 14 and a set of output transistors 16. NOR-gate pre-driver 12 is connected to input and enable# lines 18 and 20, respectively. A single output of NOR-gate 12 is connected into the first of a pair of pass gate phasing elements 14. The pair of phasing elements are denoted by reference numerals 22 and 24. A signal output by NOR-gate 12 is delayed first by pass gate 22, then again by pass gate 24. The set of output transistors includes three individual transistors, denoted 26, 28 and 30 which are connected to differing locations along the delay line of phasing elements.

In particular, a gate of transistor 26 is connected directly into the output of NOR-gate 12. A gate of transistor 28 is connected into the output of pass gate 22. Finally a gate of transistor 30 is connected into an output of pass gate 24. Drains of each of the three output transistors are connected to an output line 32.

With this configuration, during a pull down phase output transistor 26 is triggered first, then, after a time delay provided by pass gate 22, transistor 28 is triggered. Finally, after a second time delay provided by pass gate 24, output transistor 30 is triggered. In this manner, the three output transistors are sequentially triggered to generate an output signal which is pulled down from a high voltage to a low voltage at an overall rate which depends upon the switching strengths of the individual transistors and upon the delay times of pass gates 22 and 24.

A low to high signal transition is achieved by sequentially deactivating the output transistors to provide a controlled release of the output line allowing the external passive resistor (not shown) to pull up the line. The output transistors are released in the same order in which they are activated during a pull down.

Figure 2:
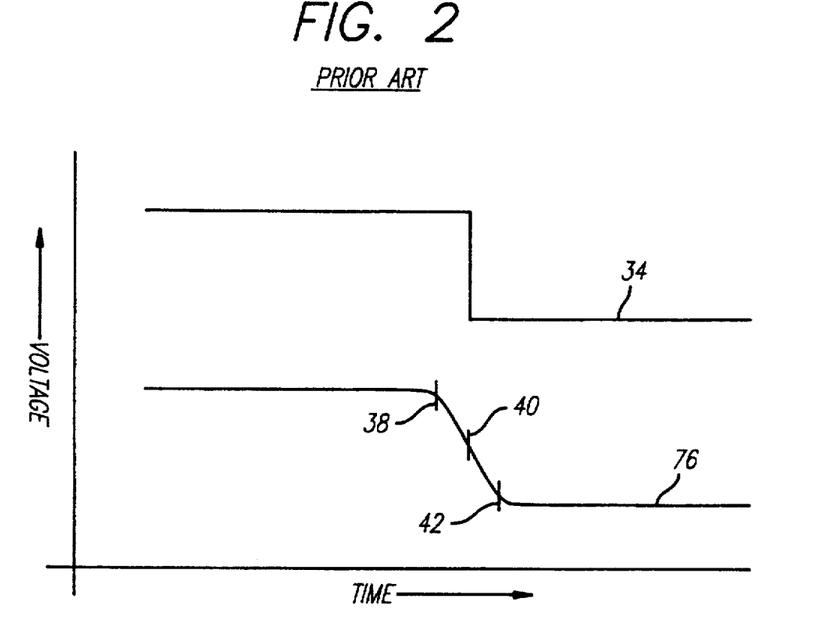
FIG. 2 graphically illustrates both theoretical and practical high to low signal transitions.

FIG. 2 illustrates an idealized high to low signal transition 34 as well as a high to low transition 36 generated by the phased output driver of FIG. 1. As can be seen, signal 36 provides a smooth and relatively noise free transition from a high voltage level to a low voltage level over a period of several nanoseconds. FIG. 2 also illustrates points in time 38, 40 and 42 when the separate output transistors 26, 28 and 30, respectively, of FIG. 1, are triggered. As can be seen, a time delay, caused by the pass gate elements, occurs between the respective triggering times. The relatively fast smooth signal transition illustrated in FIG. 2 is achieved for a high to low signal transition by ensuring that transistor 30 (FIG. 2) is much stronger than transistors 26 and 28. Transistor 30 must be much stronger than the other two transistors because it is triggered last and therefore must pull down the voltage from a level which is already rather low. However, when the same circuit releases the output line, thereby allowing the passive transistor to pull up the line, the resulting low to high transition is neither as fast nor as smooth.

Figure 3:
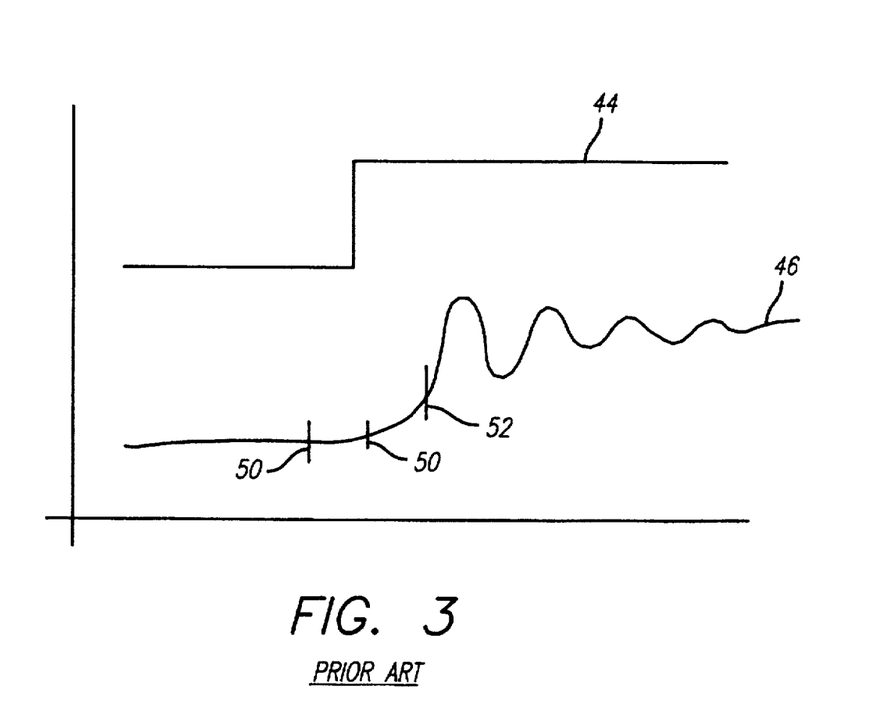
FIG. 3 graphically illustrates both theoretical and practical low to high signal transitions.

FIG. 3 illustrates an idealized low to high transition 44 and a transition 46 generated by the phased output driver of FIG. 1. Release times for the three transistors are also shown in FIG. 3. More specifically, points 48, 50 and 52 illustrate the release times of transistors 30, 28 and 26, respectively, of FIG. 1. As can be seen, the signal rises relatively slowly after the release of transistors 26 and 28, then jumps up erratically after transistor 30 is released, resulting in a substantial period of ringing which results in substantial system noise. The erratic noise occurs because transistor 30, which is triggered at time 52, is much stronger than the other two transistors. The system noise prevents prompt and reliable detection of the low to high transition by other elements connected to the bus and also prevents any prompt high to low transition.

As noted, to achieve the relatively fast transition of FIG. 2, transistor 30 must be much stronger than the other two transistors. When the transistors are operating to pull up the output signal, transistor 30, being quite strong, causes the abrupt and erratic signal transition illustrated in FIG. 3. The relative sizes of transistors could alternatively be tuned to provide for a smooth and quick low to high transition during the pull up phase, but such would result in an erratic jump in the high to low transition during the pull down phase. In known prior art systems, the sizes of transistors and the delays provided by the phasing elements are set to be equal such that adequate, but not exceptional, performance is achieved for both low to high and high to low transitions. As such, optimal data transmission rates are not achieved.

It would be desirable to provide an improved phased output driver for use with busses, particularly GTL-based busses, which achieves fast edge rates for both high to low and low to high transitions and also achieves minimal system noise levels. It is to that end that aspects of the invention are drawn.

BRIEF SUMMARY OF THE INVENTION

In accordance with one aspect of the invention, an improved phased-output driver is provided for use in connection with a computer system bus. The phased-output driver includes a pre-driver, a set of delay or phasing elements, and a set of output transistors. The pre-driver includes complementary pull up and pull down devices, such as PMOS and NMOS devices. The output transistors are connected through the delay elements to the PMOS transistors in one order but are connected to the NMOS devices of the pre-driver through the delay elements in reverse order. In this manner, the output transistors are triggered in one order to pull down an output signal and are released in reverse order to allow the output signal to be pulled up. The output transistors have differing sizes. More specifically, large, medium and small transistors are provided with the transistors arranged to be triggered in the order of small, medium to large during the pull down phase and to be released in the reverse order of large, medium to small during the pull up phase.

By providing output transistors of differing sizes and by triggering or releasing the transistors in an opposite order depending upon whether a pull down or a pull up is performed, high edge rate transitions are achieved while also achieving minimum system noise. In particular, by triggering the largest transistor last during a pull down phase, but by releasing the largest transistor first during a pull up phase, ringing problems otherwise associated with conventional phased-output drivers are avoided.

Additional improvement may be gained by tuning both the transistor sizes and the delay times provided by the phasing elements as well as the number of phasing elements and drive transistors to achieve faster delay times through a buffer containing the phasing elements (from input to pad) while maintaining controlled edge rates and reduced system noise. Other improvements may be gained by providing test inputs to the phased-output driver for selectively activating each of the output transistors for testing purposes.

Further improvements are gained by providing phasing elements in which the delay time may be selected or varied. In one embodiment, complimentary pass gates are configured with PMOS gates of each of the pass gates connected to a logic low edge rate correction signal and with NMOS gates connected to a logic high edge rate control signal. By selectively controlling the voltage level of the edge rate control signal, the impedance, and thereby the delay time, of the pass gates is also controlled. Control of the time delay in turn controls the actual edge rate of the output signal.

With this configuration, the edge rate can be controlled for optimal performance, perhaps in accordance with the physical characteristics of the system bus including the number of loads connected thereto and including the stub length, if any, of each individual load element. In this manner, optimal edge rate may be achieved in a variety of different bus systems.

The selective edge rate control of the invention is advantageously employed with the improved phased-output driver of the invention, but may also be employed with otherwise conventional phased-output drivers. Moreover, although the invention is described primarily with respect to GTL bus drivers, principles of the invention may also be employed for CMOS bus drivers. Also, although the invention is described primarily with respect to PMOS and NMOS pull up and pull down devices, the invention is applicable to other pull up and pull down devices including bipolar transistors.

In one embodiment, the invention is implemented within a GTL bus system. In general, a GTL bus can tolerate slightly faster edge rates on falling edges than on rising edges. For a falling edge, the GTL drive transistors are turned on providing a low impedance path to ground. Noise due to reflections are thereby effectively absorbed by the driver. For the rising edge, the GTL driver transistors are off and the pad is in a high impedance state. Hence, noise on the bus is not absorbed by the driver and must be damped out elsewhere on the bus. As a result, the edge rate for the falling edge has a higher allowable edge rate than that of the rising edge. This effect may be exploited in tuning the GTL output buffer. In particular, the precise order by which the transistors are turned on and off and the time delays there between may be selected to tune the buffer for optimum performance.

In each of its various embodiments, the improved phased-output driver of the invention achieves fast delay times and controlled edge rates with low system noise such that overall bus transmission rates may be increased, thereby increasing the through-put of data within a computer system incorporating the invention.

Hence, the general objectives of the invention set forth above are achieved. Other objects and advantages of the invention will be apparent from the detailed description to follow.

DETAILED DESCRIPTION OF THE INVENTION

Referring to FIGS. 4–11, exemplary embodiments of the invention will now be described.

Figure 4:
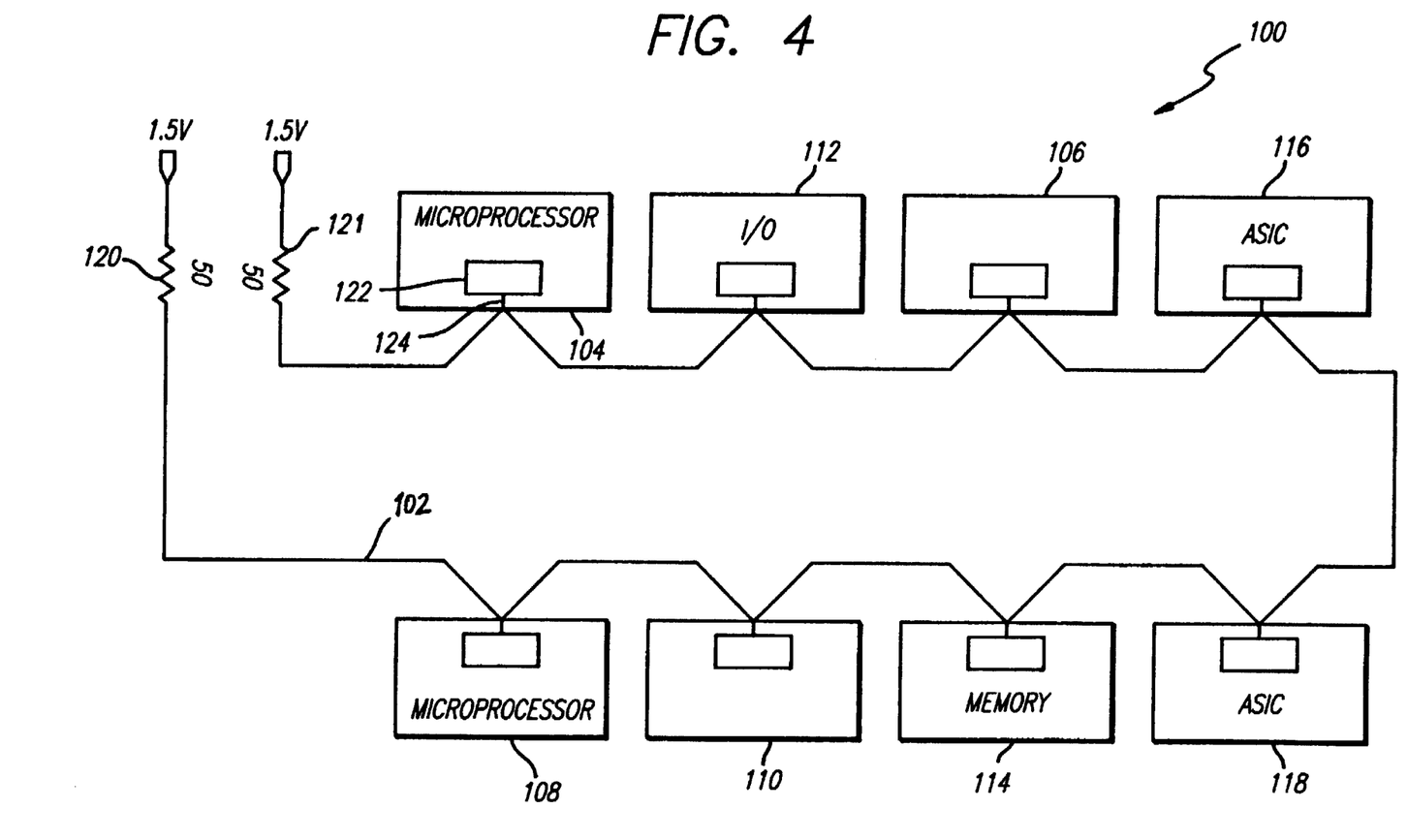
FIG. 4 illustrates a computer system incorporating phased-output drivers configured in accordance with principles of the invention.

FIG. 4 illustrates a computer system 100 having a system bus transmission line 102 interconnecting a set of microprocessors 104, 106, 108 and 110, an I/O device 112, a memory device 114, and a pair of ASIC's 116 and 118. The various system components shown connected to bus 102 are merely exemplary of computer components and a wide variety of additional or alternative computer components maybe employed. As one example, the microprocessors illustrated in FIG. 4 are Intel Architecture-based microprocessors.

As can be seen from FIG. 4, bus transmission line 102 interconnects the various computer components in a daisy chain configuration. Opposing ends of transmission line 102 are connected through resistors 120 and 122 to high voltage sources which, for example, may be set to 1.5 volts. Each individual computer component, such as microprocessor 104, includes a phased-output driver 121 connected to bus transmission line 102 by a short interconnection line or stub 124. Output driver 122 is configured for driving signals onto transmission line 102 for detection by each of the other computer components connected to the bus. The overall logic employed for the bus system illustrated in FIG. 4 is GTL logic wherein resistors 120 and 122 operate to passively pull up line 102 in the absence of any signals being asserted onto the line by output drivers 122.

Although a daisy chain configuration is illustrated, the computer components could alternatively be interconnected with other bus topologies including a single line topology, not shown, wherein each component is connected through a considerably longer stub line to a single transmission line extending between the computer components. In such an embodiment, the overall transmission line is about half of the length of the daisy chain transmission line illustrated in FIG. 4. However, the presence of the longer stub lines results in generally higher system noise than can be achieved in the daisy chain configuration of FIG. 4.

Figure 5:
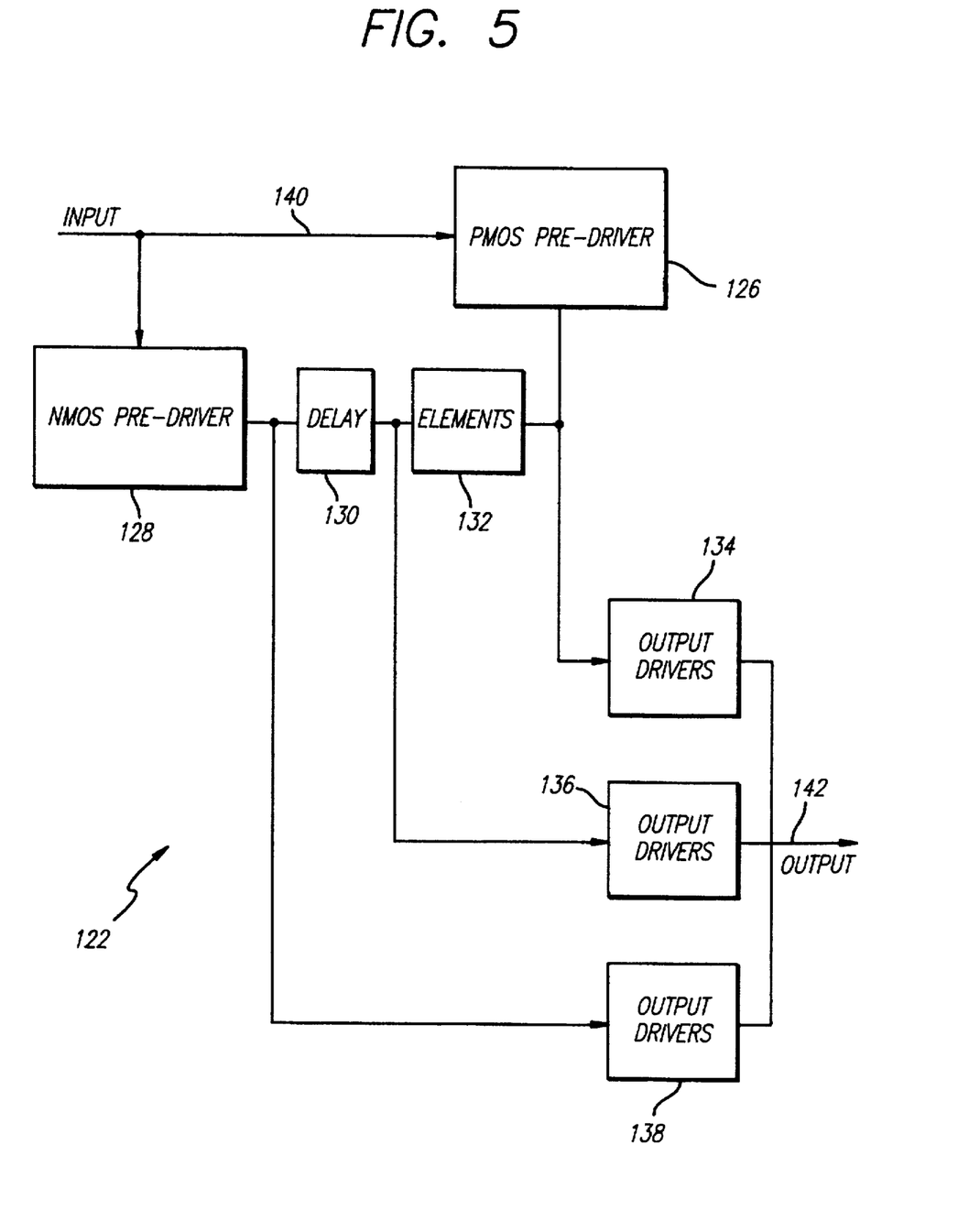
FIG. 5 is a block diagram illustrating one of the phased-output drivers of the computer system of FIG. 4.

FIG. 5 illustrates one of output drivers 122 in block diagram form. Output driver 122 includes a PMOS pre-driver 126, an NMOS pre-driver 128, first and second phasing or delay elements 130 and 132 and three output devices 134, 136 and 138. The output devices may be transistors. An input signal is received by both PMOS pre-driver 126 and NMOS pre-driver 128 along input line 140. An output signal is generated by a combination of outputs provided by the three output devices along an output line 142. As noted above, although the invention is primarily described herein with reference to PMOS and NMOS elements, the invention may also be applied to other pull up and pull down devices as well.

Phasing elements 130 and 132 are both bi-directional phasing elements. An output of NMOS pre-driver 128 is connected directly into output device 138. The output of NMOS pre-driver 128 is also connected through phasing element 130 into output device 136. Finally, the output of NMOS pre-driver 128 is connected through both delay elements 130 and 132 into output device 134. As such, signals received by the output devices from NMOS pre-driver 128 are respectively delayed.

An output of PMOS pre-driver 126 is also connected into each of the output devices, but in a reverse order. In particular, the output of PMOS pre-driver 126 is connected directly into output device 134, whereas output devices 136 and 138 receive respectively delayed versions of the output signal from PMOS driver.

As configured, the output devices are triggered in one order in response to signals received from the PMOS pre-driver and are released in an opposite order in response to signals received from the NMOS driver. With a suitable choice and number of output devices, the edge rate of a signal output along line 142 may be tuned or optimized for high pull down and pull up edge rates while also limiting system noise.

Figure 6:
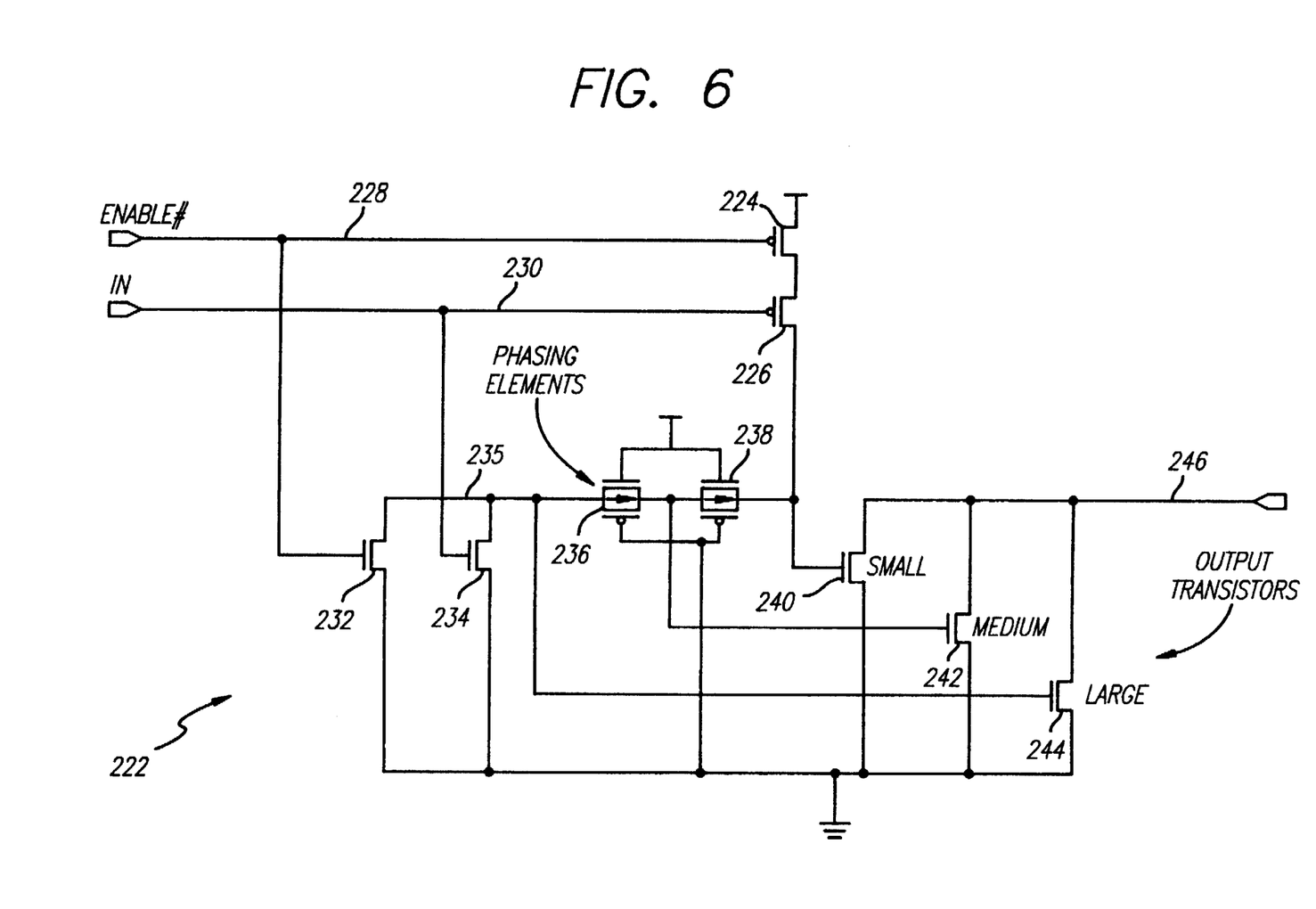
FIG. 6 is a schematic diagram of a first exemplary embodiment of the phased-output driver of FIG. 5.

A particular implementation of the output driver of FIG. 6 is illustrated in FIG. 5. The implementation of FIG. 6 employs PMOS transistor elements as the PMOS driver, NMOS transistor elements as the NMOS driver, complimentary pass gates as the phasing elements, and a set of small, medium and large transistors as the output devices. More specifically, FIG. 6 illustrates an output driver 222 having a pair of PMOS pre-driver transistors 224 and 226 with gates respectively connected to an input enable# line 228 and an input line 230. Output driver 222 also includes a pair of NMOS pre-driver transistors 232 and 234 having gates also connected to input lines 228 and 230. A connection line connecting the drains of NMOS transistors 232 and 234 to the drain of PMOS transistor 226 passes through a set of pass gates 236 and 238.

Small, medium and large output transistors 240, 242 and 244 have drains connected to an output line 246, sources connected to ground, and gates connected to differing points or nodes along line 235.

As configured, PMOS transistors 224 and 226, when activated with appropriate input signals, trigger a pull down phase which sequentially triggers transistors 240, 242 and 244 in that order. Hence, during pull down, the smallest transistor is triggered first, then after a delay period caused by pass gate 238, the medium transistor is triggered. Finally, after a second delay period caused by pass gate 236, the largest transistor is triggered.

During a pull up phase, NMOS transistors 232 and 234 sequentially turn off transistors 244, 242, and 240, in that order. Hence, during pull up, the largest transistor is released first, then after a first delay period caused by pass gate 236, the medium transistor is released. Finally, after a second delay period caused by pass gate 238, the smallest transistor is released.

Figure 7:
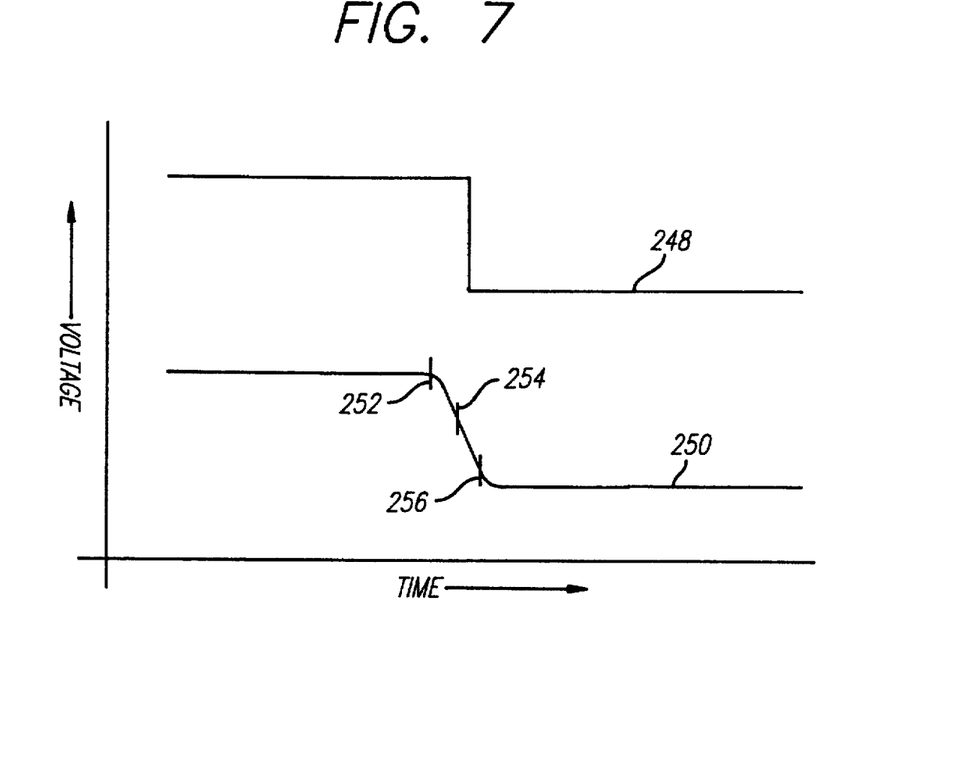
FIG. 7 is a graphical illustration of theoretical and practical high to low signal transitions generated by the phased-output driver of FIG. 6.

FIG. 7 illustrates a theoretical high to low signal transition 248 and a high to low transition to 50 generated by the output driver of FIG. 6. As can be seen, a fairly prompt signal transition is achieved with minimal signal ringing. Within FIG. 7, the triggering times of transistors 240, 242 and 244 are identified by reference numerals 252, 254 and 256, respectively. By triggering the small and medium transistors first to initiate the pull down, and by triggering the largest transistor last, the overall rapid signal transition is achieved.

Figure 8:
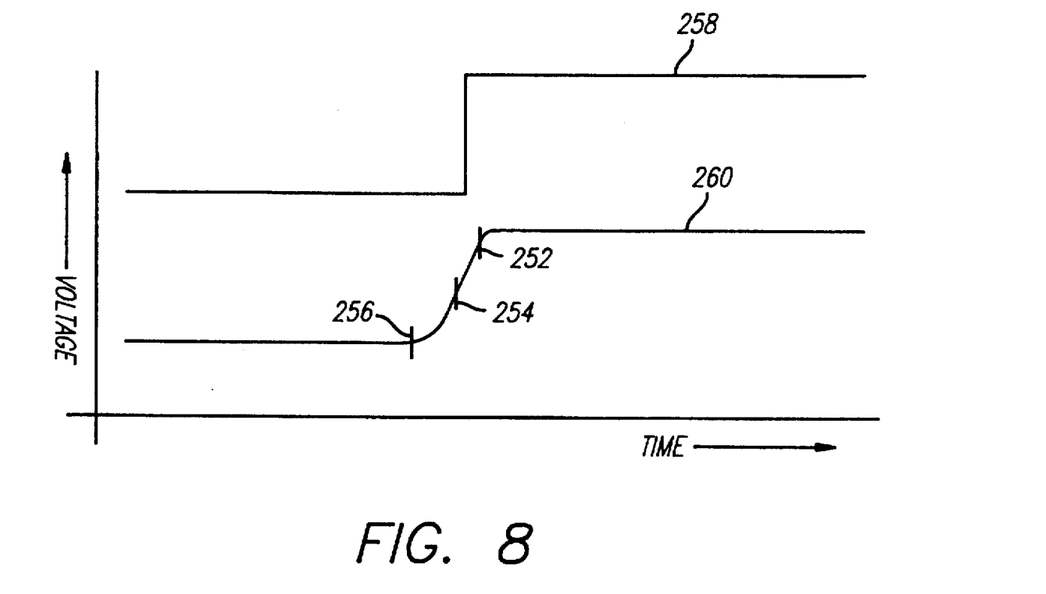
FIG. 8 is a graphical illustration of theoretical and practical low to high signal transitions generated by the phased-output driver of FIG. 6.

FIG. 8 graphically illustrates the output signal generated by the output driver of FIG. 6 during a pull up phase wherein the output transistors are released in reverse order. In particular, FIG. 8 illustrates a theoretical low to high transition 258 and an actual output signal 260 with the release times of transistors 240, 242 and 244 identified by reference numerals 252, 254 and 256, respectively. As can be seen, the largest transistor is released first causing a significant increase in the signal level. The medium and small transistors are released later to complete the low to high transition. By releasing the largest transistor first during the pull up phase, the ringing problems illustrated in FIG. 3 are avoided and a controlled edge rate is achieved with minimum buffer delay.

Now the operation of output driver 222 will be described in greater detail. The following assumes that the enable# signal is set for enabling operation of the output transistor. Initially, the input line is high. The output line is also high as a result of the passive resistor (not shown) pulling up the transmission line. The input signal is switched low, causing PMOS transistor 226 to turn on thereby activating output transistor 240 which begins to pull down the voltage applied to output line 246 as a result of the connection to ground. The transition of the input line from high to low also triggers NMOS pre-driver transistor 234 to switch OFF allowing line 235 to be pulled up by PMOS transistor 226 through the phasing elements.

The output signal from PMOS transistor 226 propagates through pass gate 238 where it is then applied to the gate of output transistor 242, triggering transistor 242 to pull the voltage on output line 246 still lower. Eventually, the output signal from PMOS transistor 226 propagates through pass gate 236 where it is applied to the gate of large transistor 244 causing transistor 244 to activate thereby pulling down the voltage along line 246 even lower.

The foregoing sequence of steps is generally reversed for the pull down operation when the input signal is switched from low to high causing PMOS transistor 226 to turn off and NMOS transistor 234 to turn on.

Thus, FIG. 6 illustrates one implementation of the phased-output driver of the invention. The implementation of FIG. 6 includes pass gates as phasing elements. However, any suitable delay element may alternatively be employed. For example, invertors or resistors may be employed. Indeed, even a length of transmission line may be employed with the length selected to achieve suitable propagation delay. Pass gates are preferred for certain applications since pass gates are relatively small. The implementation of FIG. 6 also illustrates separate PMOS and NMOS pre-drivers which collectively form a complimentary NOR-gate driver. Again, however, other pre-driver elements may be employed. For example, an invertor may be employed wherein only a single PMOS transistor and a single NMOS transistor are employed. A wide range of other pre-drivers may be alternatively employed as well. Generally, however, complementary pre-driver components are preferred since such allows the PMOS components of the pre-driver to be separated from the NMOS components of the pre-driver. Finally with respect to FIG. 6, the output elements are illustrated as NMOS transistors but other suitable output devices may alternatively be employed.

Figure 9:
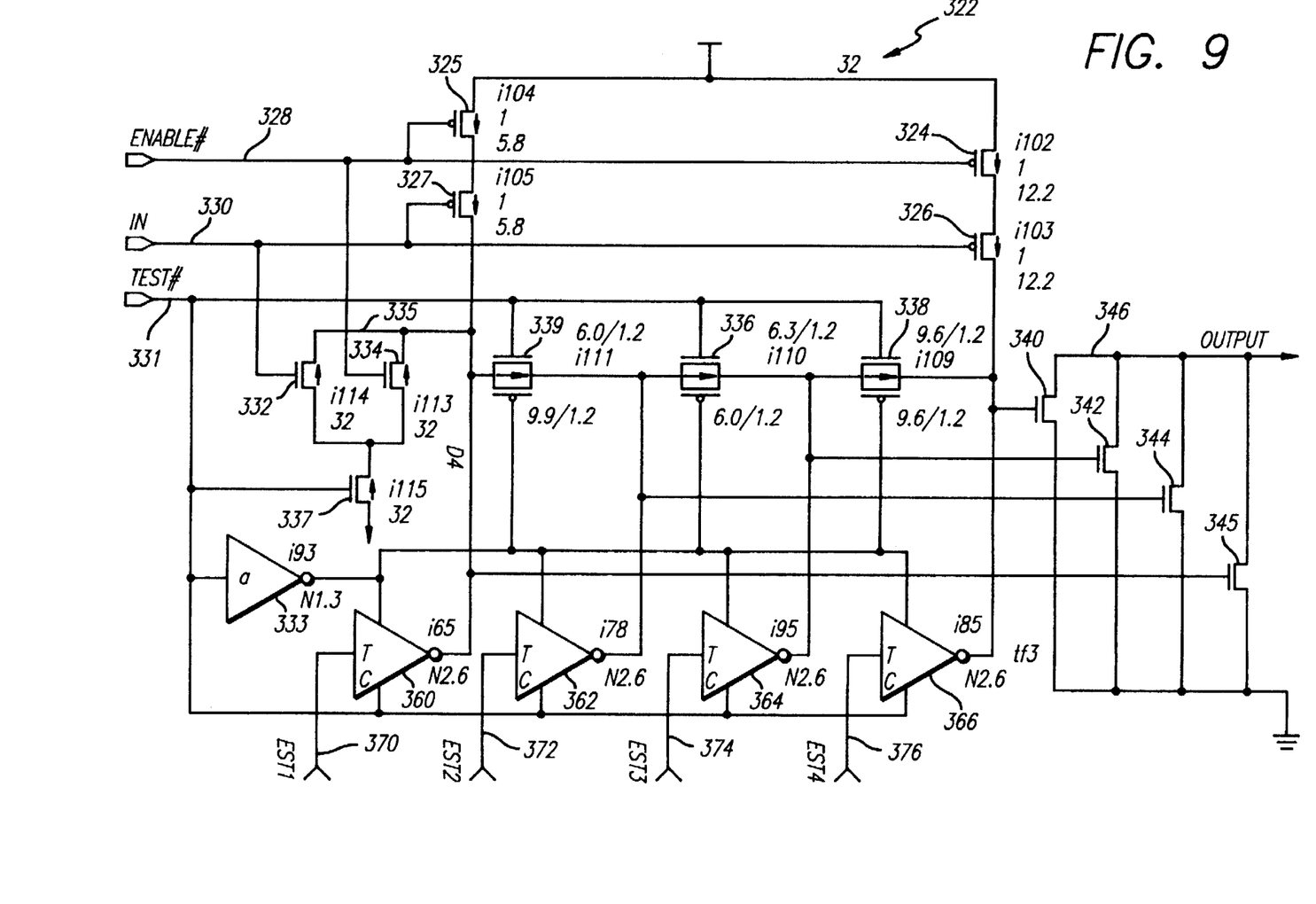
FIG. 9 is a circuit schematic of a second exemplary embodiment of the output driver of FIG. 5, particularly illustrating a testability feature.

With reference to FIG. 9 a second embodiment of the invention will now be described. FIG. 9 illustrates a phased-output driver 322 having many of the same elements as output driver 222 of FIG. 6. Common elements are illustrated with like reference numerals, incremented by 100. Only pertinent differences will be described.

Output driver 322 includes four output transistors 340, 342, 344 and 345 in connection with three pass gates 336, 338 and 339. The additional pass gate and output transistor as compared to the driver of FIG. 6 allows for more precise control of the output signal than can be achieved with the two pass gate, three output transistor driver of FIG. 6.

Two additional pull up PMOS transistors 325 and 327 are provided along with primary pull up transistors 324 and 326. Additional pull up transistors 325 and 327 are respectively connected to enable# and input lines 328 and 330. Additional pull up transistors 325 and 327 are connected into the largest of the output transistors 345 for providing additional pull down control. However, whereas the largest output transistor 345 is not triggered by primary PMOS transistors 324 and 326 until after a delay time provided by pass gates 338, 336 and 339, transistor 345 is partially triggered almost immediately by secondary pull down transistors 325 and 327. Such allows the largest transistor to begin to operate while the smaller transistors 340, 342 and 344 are being triggered, such that the largest transistor will be more effective when fully activated by the primary PMOS transistors. Without the secondary PMOS transistors, the delay of the turn on of output transistor 345 may be excessive, causing lower edge rates than desired, and increased delay through the buffer. Although not shown, additional secondary transistors may be provided for providing pre-triggering of output transistors 342 and 344, although for many applications such is not necessary.

Output driver 322 also includes test circuitry for selectively activating each of the output transistors such that their proper operation can be verified during testing of the circuit. More specifically, a test# input line 331 is provided which is connected directly to the NMOS gates of pass gates 336, 338 and 339 and is connected, through an invertor 333, to the PMOS gates of the pass gates. This is to be contrasted with output driver 226 of FIG. 6 wherein the pass gates are merely connected between high voltage and ground. Output driver 322 also includes a set of four clocked invertors 360, 362, 364 and 368. Enable inputs of the clocked invertors are interconnected to the output of invertor 333 and to the PMOS gates of pass gates 336, 338 and 339. Enable# inputs of invertors 360–368 are connected to test# input line 331. Inputs to invertors 360–368 are connected to separate test input lines 370, 372, 374 and 376.

In a test mode, active signals are applied along lines 330, 331 and 328 to disable the PMOS and NMOS predrivers while also disabling the pass gates. Thereafter, test signals are selectively input along lines 370–376 to selectively trigger the output transistors such that the operation of each output transistor can be verified. More specifically, to put the buffer in test mode, enable# is pulled high, and the test# signal is pulled low. At this point, the PMOS and NMOS pre-driver sections are disabled. Transistors 324 and 325 turn off the PMOS section, and device 337 turns off the NMOS section. As such, the input is a "don't care". Then, the pre-drivers and pass gates 339, 336 and 338 are disabled, and the tri-state inventors 360, 362, 364 and 366 are enabled. Output transistors 340, 342, 344 and 345 are individually controlled by test1, test2, test3 and test4 inputs respectively. In this manner, each drive transistor can be individually tested.

During a regular operation mode, an inactive signal is applied along test line 331 for reactivating pass gates 336, 338 and 339 and deactivating each of the test invertors 360–366. With the test mode deactivated, the circuit operates as described above to selectively pull down or pull up the output signal along line 346 based upon input and enable signals received along lines 330 and 328, respectively.

Finally with respect to FIG. 9, output driver 322 also includes an additional NMOS pull up transistor 337 which is connected between ground and pull down transistors 332 and 334. Additional NMOS transistor 337 is provided for use in inverting the enable# signal. Exemplary sizes of circuit components for use within output driver 322 are provided in Table I. The sizes provided in Table I are gate width/gate length in microns.

TABLE I

| DEVICE | | SIZE |
| --- | --- | --- |
| PMOS Transistor | 325 | 5.8/0.7 |
| " | 323 | 5.8/0.7 |
| " | 324 | 12.2/0.7 |
| " | 326 | 12.2/0.7 |
| NMOS Transistor | 332 | 32/0.7 |
| " | 334 | 32/0.7 |
| " | 337 | 32/0.7 |
| PMOS Pass Gate Transistor | 339 | 9.9/1.2 |
| NMOS Pass Gate Transistor | 339 | 6.0/1.2 |
| PMOS Pass Gate Transistor | 336 | 6.0/1.2 |
| NMOS Pass Gate Transistor | 336 | 4.3/1.2 |
| PMOS Pass Gate Transistor | 338 | 5.6/1.2 |
| NMOS Pass Gate Transistor | 338 | 5.6/1.2 |
| NMOS Output Transistor | 340 | 46.1/0.7 |
| " | 342 | 91.7/0.7 |
| " | 344 | 137.8/0.7 |
| " | 345 | 182.9/0.7 |
| Invertor | 333 | N 1.3/0.7,P1.6/0.7 |
| " | 360 | N 2.6/0.7,P1.6/0.7 |
| " | 362 | N 2.6/0.7,P1.6/0.7 |
| " | 364 | N 2.6/0.7,P1.6/0.7 |
| " | 366 | N 2.6/0.7,P1.6/0.7 |

In an alternative embodiment of the circuitry of FIG. 9, the test# input signal line is eliminated and an invertor is connected between the enable# line and the pass gates, invertor 333 and the enable# inputs to invertors 360–366. Transistor 334 is eliminated. In the alternative embodiment, to enter test mode, the enable# must be pulled high. Such disables the pre-drivers and pass gates and enables the test tri-state buffers. The drive transistors are then individually driven by the test input. The alternative embodiment has the advantage that a signal route, namely the test# signal line, is eliminated without loss of functionality. As can be appreciated, the sizes of the various devices in the alternative embodiment may differ from those of the embodiment of FIG. 1 set forth in Table I.

Figure 10:
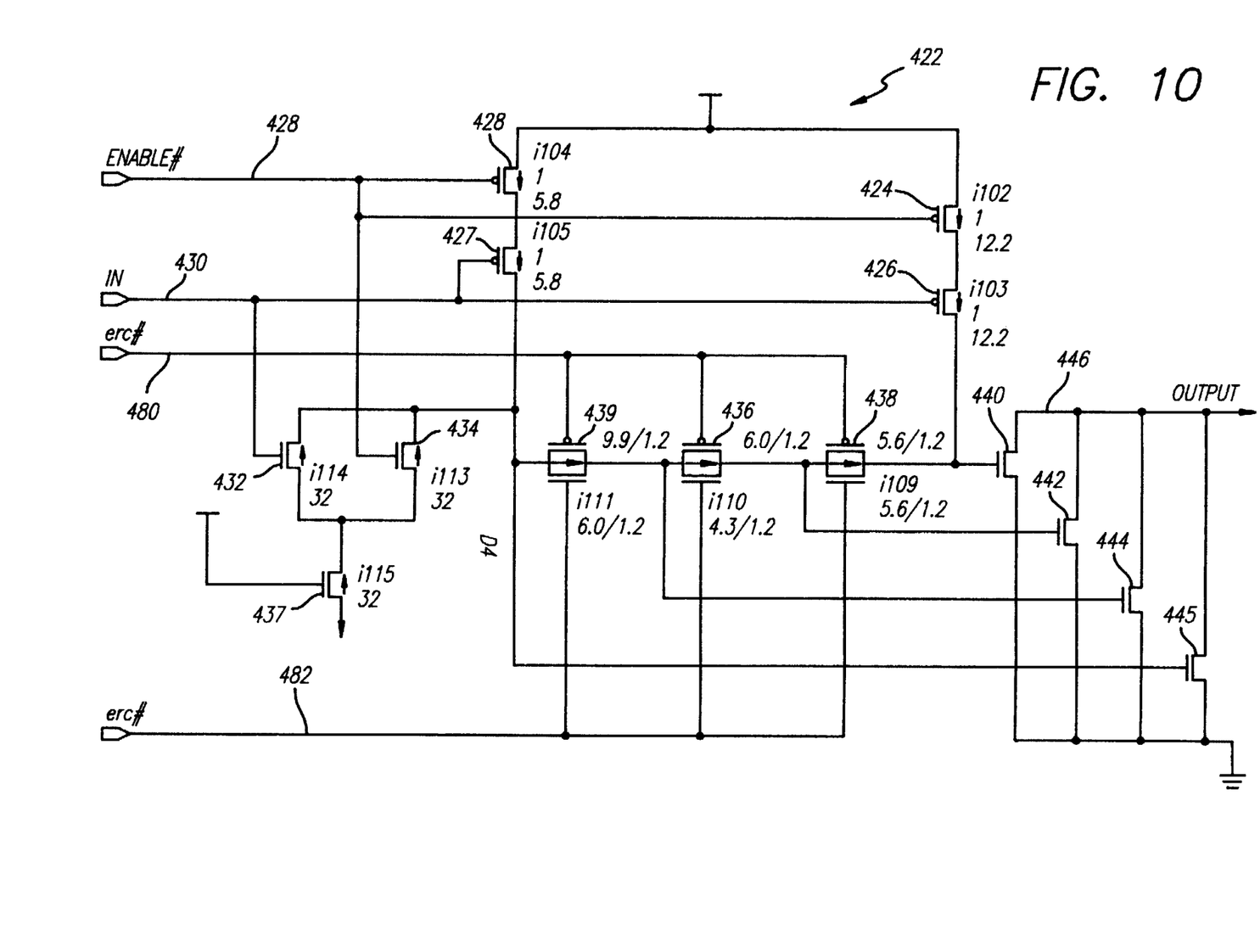
FIG. 10 is a circuit schematic of a third exemplary implementation of the output driver of FIG. 5, particularly illustrating an adjustable edge rate control capability.

Referring to FIG. 10, a third embodiment of the invention will now be described. FIG. 10 illustrates a phased-output driver 442 having many devices in common with the output drivers of FIGS. 6 and 9 with similar devices being identified by like reference numerals incremented by 100 from those of FIG. 9. Only pertinent differences between the output driver of FIG. 10 and the output drivers of the FIGS. 6 and 9 will be described.

Output driver 422 is provided with an edge rate control circuit for allowing the amount of delay provided by pass gates 436, 438 and 439 to be selectively controlled thus allowing the edge rate for the pull down and pull up of the output signal to also be selectively controlled. More specifically, an edge rate control# (ERC#) input line 480 is connected to the PMOS gates of each of pass gates 436, 438 and 439. An edge rate control (ERC) input line 42 is connected to each of the NMOS gates of pass gates 436, 438 and 439. By selecting the voltage level for the ERC control input signals, by appropriate means not shown, the impedance through pass gates 436, 438 and 439 is varied such that the delays generated by the pass gates are also varied. To achieve the least amount of delay and the fastest edge rates, the ERC and ERC# signals are set to the rail voltages. To achieve the greatest amount of delay and the slowest edge rates, the ERC and ERC# signals are set to intermediate voltages.

By varying the delays provided by the pass gates, the triggering and release times of the output transistors are varied, thereby changing the slope of the pull down and pull up of the output signal. Such allows the edge rate for the output signals to be tuned, perhaps in accordance with physical characteristics of the particular computer system employing the output drivers. For example, the edge rate may be controlled based upon the number of loads applied to the overall system bus line and in accordance with the stub length of stubs between the output drivers and main bus transmission line.

Figure 11:
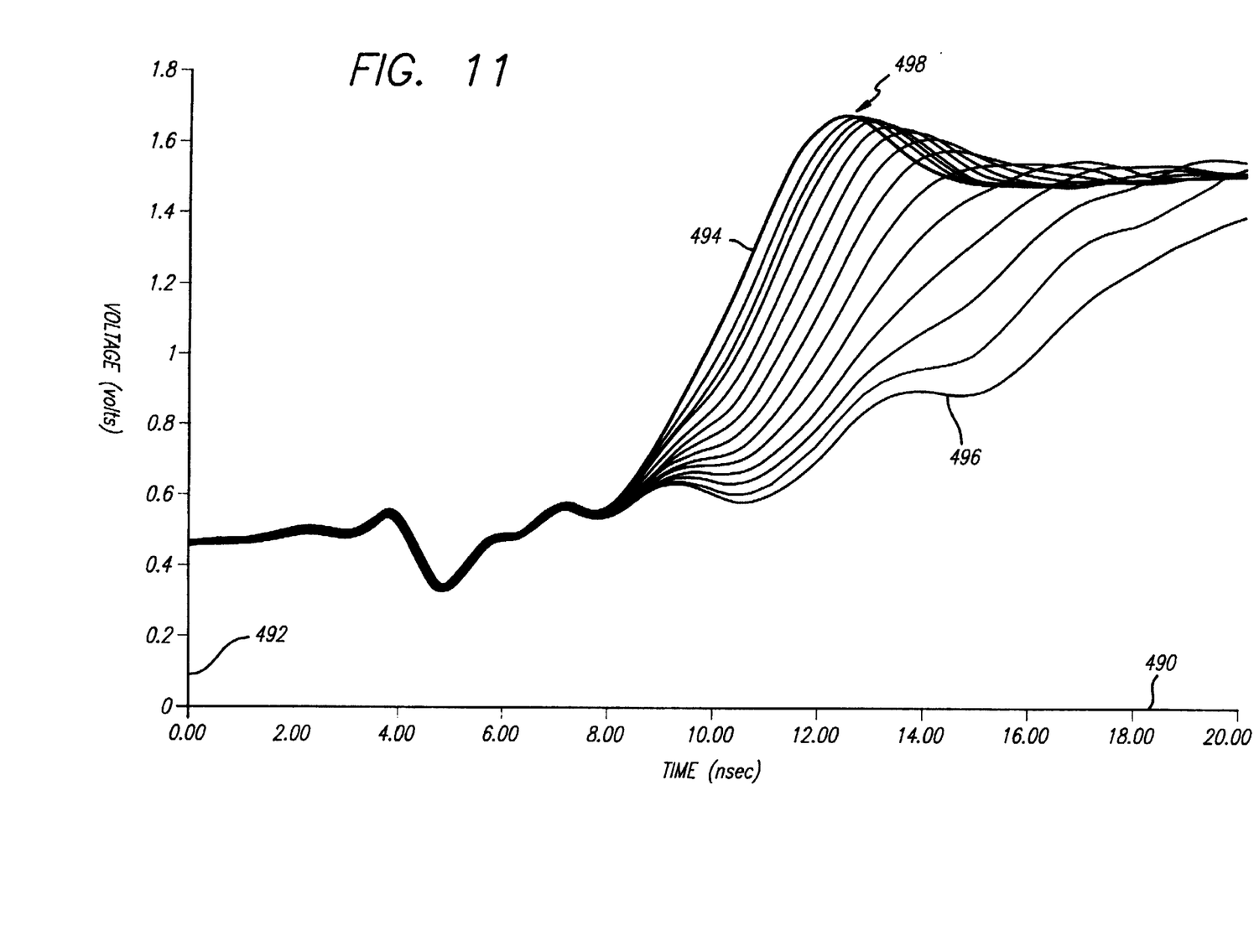
FIG. 11 is a graphical illustration of actual low to high signal transitions generated by the output driver of FIG. 10 for a variety of edge rate control input signal levels.

FIG. 11 is a graph illustrating actual measured output signals as a function of time for a pull-up for various voltage levels for the ERC and ERC# signals. In FIG. 11, time in nanoseconds is represented along the horizontal axis 490 and the output signal in volts is represented along the vertical axis 492. The pull up operation illustrated in FIG. 11, was triggered at a point in time along the horizontal axis of about eight nanoseconds. Signal trace 494 illustrates the output voltage when the ERC and ERC# signals are set to the rails. Each of the remaining signal traces illustrates the output signal for differing values of the ERC and ERC# signals, with trace 496 illustrating a signal output when the ERC and ERC# signals are set to be equal to one another at an intermediate voltage level. As can be seen, the smoothest and fastest edge transition is achieved by setting the ERC and ERC# signals to the rails. However, a certain amount of overshoot occurs, identified by reference numeral 498, before the output signal stabilizes at a voltage of about 1.5 volts. The overshoot may result in system noise. By setting the ERC values to be closer to one another, the amount of overshoot is decreased but the edge rate likewise decreases. For the slowest edge rates, such as illustrated by trace 496, the signal trace exhibits a step behavior caused by sequentially releasing the output transistors with too much delay between successive releases. The step behavior may further result in system noise. For edge rate control in this area, it may be desirable to add more stages.

The traces illustrated in FIG. 11 were measured for an eight load computer bus system with the driver operating at a load at one end of the daisy chain system bus transmission line and the signals being detected at a load at an opposing end of the signal line. Differing traces may result by detecting the signals at different locations on the system bus or by generating the signals from differing output drivers. Nevertheless, FIG. 11 generally illustrates that the edge rate can be selectively controlled using the output driver of FIG. 10. Finally with regard to FIG. 11, it should be noted that each of the traces in FIG. 11 exhibits initial perturbations prior to the triggering time of eight nanoseconds. The initial perturbations are likely the result of ground perturbations within the integrated circuit caused by operation of a clock distribution tree.

Table II provides exemplary sizes for the various devices illustrated in FIG. 10.

TABLE II

| DEVICE | | SIZE |
| --- | --- | --- |
| PMOS Transistor | 425 | 5.8/0.7 |
| " | 423 | 5.8/0.7 |
| " | 424 | 12.2/0.7 |
| " | 426 | 12.2/0.7 |
| NMOS Transistor | 432 | 32/0.7 |
| " | 434 | 32/0.7 |
| " | 437 | 32/0.7 |
| PMOS Pass Gate Transistor | 439 | 9.9/1.2 |

TABLE II-continued

| DEVICE | | SIZE |
|---|---|---|
| NMOS Pass Gate Transistor | 439 | 6.0/1.2 |
| PMOS Pass Gate Transistor | 436 | 6.0/1.2 |
| NMOS Pass Gate Transistor | 436 | 4.3/1.2 |
| PMOS Pass Gate Transistor | 438 | 5.6/1.2 |
| NMOS Pass Gate Transistor | 438 | 5.6/1.2 |
| NMOS Output Transistor | 440 | 46.1/0.7 |
| " | 442 | 91.7/0.7 |
| " | 444 | 137.8/0.7 |
| " | 445 | 182.9/0.7 |

What have been described are exemplary embodiments of an improved phased-output driver for use with a GTL-based bus system. Each of the output drivers provides improved pull down and pull up edge rates in part by triggering or releasing output transistors of differing sizes in opposite order depending upon whether a pull down or a pull up operation is performed. Further improvement may be gained by providing for actual control of the delay times of the delay elements by using an edge rate control circuit. It should be noted that the edge rate control circuit need not be employed only in connection with the improved output driver configuration having the above-described opposite-order triggering. Rather, the edge rate control circuit may be employed within otherwise conventional phased-output drivers for varying the delay times therein. Likewise, the testability feature described above may also be employed within otherwise conventional output drivers. Finally, although each of the embodiments illustrated in the figures are based on GTL technology, principles of the invention may alternatively be employed for other switching technologies, such as CMOS.

As far as GTL embodiments are concerned, as noted above, a GTL bus can tolerate slightly faster edge rates on a falling edge than on a rising edge. For the falling edge, the GTL drive transistors are turned on providing a low impedance path to ground whereby noise due to reflections is eliminated or absorbed by the driver. For the rising edge, the GTL driver transistors are off and the pad is in a high impedance state or condition such that noise on the bus is not absorbed by the driver and must be damped out elsewhere. In one exemplary implementation, the result is a higher allowable edge rate on the falling edge of 1.0 volts/nanoseconds as compared to the allowable edge rate on the rising edge of 0.8 volts/nanoseconds. The GTL output driver may be tuned in a manner which exploits the foregoing difference. For example, for a rising edge, the drive transistors may be turned off in the order of smallest to largest whereas for the falling edge the drive transistors may be turned on in an order which is not exactly opposite that of the turn off order. For output drivers gate 0, gate 1, gate 2 and, gate 3, arranged in order of smallest to largest, the turn off order may be gate 1, gate 1, gate 2, gate 3, whereas the turn on order may be gate 3, gate 2, gate 0, gate 1. As can be appreciated, the exact order by which the output drivers are turned on and turned off may be selected to achieve other advantages or objectives as well.

The circuitry described herein can be configured using a wide variety of fabrication techniques, including, for example, silicon or gallium arsenide techniques. As noted above, the output drivers may be employed in a wide range of computer, and other, devices. In one embodiment, the output drivers are employed within microprocessors configured in accordance with Intel processor Architecture. In other embodiments, the output drivers may be employed within microprocessors configured in accordance with PowerPC™ technology.

Although preferred and exemplary implementations of the invention have been described, such are merely illustrative of the invention and should not be construed as limiting the scope of the invention. Rather, principles of the invention may be exploited within a wide range of implementations for a wide range of applications.

What is claimed is:

1. In a phased-output driver having a pre-driver with complementary pull-down and pull-up components, a set of delay elements, and a set of output devices, wherein said pull-down components are connected through said delay elements to said output devices for sequentially activating said output devices and said pull-up components are connected through said delay elements to said output devices for sequentially deactivating said output devices, an improvement comprising:

connecting said pull-down components to said output devices through said delay elements for activating said output devices in a first predetermined order, said output devices comprising transistors of differing sizes and said pull-down pre-driver components being connected through said delay elements for activating said output transistors in order from smallest to largest; and connecting said pull-up components to said output devices through said delay elements for deactivating said output devices in a second predetermined order, said pull-down pre-driver components are connected through said delay elements for activating said output transistors in order from largest to smallest.

2. The improvement of claim 1, wherein the pull-down components are PMOS components and pull-up components are NMOS components.

3. A phased-output driver comprising:

a pre-driver having complimentary pull-down and pull-up components;

a set of delay elements; and a set of output devices; wherein said pull-down components of said pre-driver are interconnected through said delay elements to said output devices for sequentially triggering activation of said output devices in a first order; and wherein said pull-up components of said pre-driver are interconnected through said delay elements to said output devices for sequentially triggering activation of said output devices in a second order, with said second order differing from said first order.

4. The phased-output driver of claim 3, wherein said output devices are transistors of differing sizes.

5. The phased-output driver of claim 4, wherein said pull-down pre-driver components are connected through said delay elements for activating said output transistors in order from smallest to largest; and wherein said pull-up pre-driver components are connected through said delay elements for activating said output transistors in order from largest to smallest.

6. The phased-output driver of claim 3, wherein said delay elements are pass gates.

7. The phased-output driver of claim 3, wherein said pre-driver is a NOR-gate.

8. The phased-output driver of claim 6, wherein first and second delay elements and first, second and third output devices are provided and wherein said first output device is connected directly to said pull-down pre-driver components and is connected through said first and second delay components to said pull-up pre-driver components;

said second output device is connected through said first delay elements to said pull-down pre-driver components and is connected through said second delay component to said pull-up pre-driver components; and said third output device is connected through said first and second delay elements to said pull-down pre-driver components and is connected directly to said pull-up pre-driver components.

9. The phased-output driver of claim 6, wherein said pass gates each include pull-down and pull-up transistors.

10. The phased-output driver of claim 9, wherein gates of said pull-up transistors of said pass gates are connected to a high voltage source and wherein gates of said pull-down transistors of said pass gates are connected to ground.

11. The phased-output driver of claim 3, further including means for controlling the delay provided by said delay elements.

12. The phased-output driver of claim 9, wherein said pass gates are connected to a variable voltage power source for controlling the delay provided by said pass gates.

13. The phased-output driver of claim 9, wherein gates of said pull-up transistors of said pass gates are connected to a first voltage line and wherein gates of said pull-down transistor components of said pass gates are connected to a second voltage line and wherein voltages provided on either or both of said voltage lines are variable.

14. The phased-output driver of claim 8, further including a second set of pull-down pre-driver components connected directly to said third output device.

15. The phased-output driver of claim 14, wherein said pull-down pre-driver components are pull-down transistors and said second set of pull-down pre-driver components, which are connected directly to said third output transistor, are smaller in size than said set of pull-down pre-driver components connected through said first and second delay elements to said third output transistor.

16. The phased-output driver of claim 3 further including testing means for selectively activating said output devices.

17. The phased-output driver of claim 8 wherein gates of said pull-up transistors of said pass gates are connected to a test enable line;

gates of said pull-down transistor components of said pass gates are connected through an invertor to said test enable line; and wherein a set of invertors are provided, one per output device, with said test invertors each having a clock input connected to said test enable line;

an inverted clock input connected through said invertor to said test enable line;

an input connected to a respective test input line; and an output connected to a respective output device.

18. The phased-output driver of claim 3 wherein the pull-down components are PMOS components and the pull-up components are NMOS components.

19. A computer system comprising:

a microprocessor;

an ASIC device;

a bus interconnecting said microprocessor and said ASIC device; and wherein said microprocessor and said ASIC device each include a phased-output driver connected through a stub line to said bus, each of said phased-output drivers having a pre-driver having complimentary pull-down and pull-up components;

a set of delay elements; and a set of output devices; wherein said pull-down components of said pre-driver are interconnected through said delay elements to said output devices for sequentially triggering activation of said output devices in a first order; and wherein said pull-up components of said pre-driver are interconnected through said delay elements to said output devices for sequentially triggering activation of said output devices in a second order, differing from said first order.

20. The computer system of claim 19, wherein said phased-output driver and said bus are configured in accordance with GTL.

21. The computer system of claim 19, wherein said output devices are transistors of differing sizes.

22. The computer system of claim 21, wherein said pull-down components are connected through said delay elements for activating said output transistors in order from smallest to largest; and wherein said pull-up components are connected through said delay elements for activating said output transistors in order from largest to smallest.

23. The computer system of claim 19, wherein said delay elements are pass gates.

24. The computer system of claim 19, wherein said pre-driver is a NOR-gate.

25. The computer system of claim 23, wherein first and second delay elements and first, second and third output devices are provided and wherein said first output device is connect directly to said pull-down pre-driver components and is connected through said first and second delay components to said pull-up pre-driver components;

said second output device is connect through said first delay elements to said pull-down pre-driver components and is connected through said second delay component to said pull-up pre-driver components; and said third output device is connect through said first and second delay elements to said pull-down pre-driver components and is connected directly to said pull-up pre-driver components.

26. The computer system of claim 23, wherein said pass gates each include pull-down and pull-up transistors.

27. The computer system of claim 26, wherein gates of said pull-up transistors of said pass gates are connected to a high voltage source and wherein gates of said pull-down transistor components are connected to ground.

28. The computer system of claim 19, further including means for controlling the delay provided by said delay elements.

29. The computer system of claim 23, wherein said pass gates are connected to a variable voltage power source for controlling the delay provided by said pass gates.

30. The computer system of claim 26, wherein gates of said pull-up transistors of said pass gates are connected to a first voltage line and wherein gates of said pull-down transistor components of said pass gates are connected to a second voltage line and wherein voltages provided on either or both of said voltage lines are variable.

31. The computer system of claim 25, further including a second set of pull-down pre-driver components connected directly to said third output device.

32. The computer system of claim 31, wherein said pull-down pre-driver components are pull-down transistors and said second set of pull-down pre-driver components, which are connected directly to said third output transistor, are smaller in size than said set of pull-down pre-driver components connected through said first and second delay elements to said third output transistor.

33. The computer system of claim 19 further including testing means for selectively activating said output devices.

34. The computer system of claim 26 wherein
gates of said pull-up transistors of said pass gates are connected to a test line;
gates of said pull-down transistor components of said pass gates are connected through an invertor to said test voltage line; and
wherein a set of invertors are provided, one per output device, with said test invertors each having
a clock input connected to said test line;
a inverted clock input connected through said invertor to said test line;
an input connected to a respective test input line; and
an output connected to a respective output device.

35. The computer system of claim 19 wherein said pull-down components are PMOS components and said pull-up components are NMOS components.

36. A method for asserting signals onto an output line connected to a passive external pull up device, said method comprising the steps of: triggering a first output device to pull a voltage along the output line down by a first predetermined amount;
triggering a second output device, after a time delay period, to pull the voltage along the output line down by a second predetermined amount; and
triggering a third output device, after a time delay period, to pull the voltage along the output line down by a third predetermined amount; then
releasing said third output device to allow the voltage along the output line to be pulled up by a fourth predetermined amount;
releasing said second output device, after a time delay period, to allow the voltage along the output line to be pulled by a fifth predetermined amount; and
releasing said first output device, after a time delay period, to allow the voltage along the output line to be pulled up by a sixth predetermined amount.

37. The method of claim 36,
wherein said steps of triggering said output devices comprise the steps of
applying a triggering signal directly to said first output device;
passing said triggering signal through a first delay element before applying to said second output device; and
passing said triggering signal through first and second delay elements before applying to said third output device; and wherein said steps of releasing said output devices comprise the steps of
applying a release signal directly to said third output device;
passing said release signal through said second delay element before applying to said second output device; and
passing said release signal through said first and second delay elements before applying to said first output device.

38. A method for asserting signals onto an output line connected to a passive external pull up transistor by using a phased-output driver having a pre-driver with complimentary pull-down and pull-up components, first and second delay elements, and first, second and third output devices, said method comprising the steps of:
applying a triggering signal from the pull-down pre-driver components directly to the first output device;
passing said triggering signal from the pull-down pre-driver components through the first delay element before applying to the second output device; and
passing said triggering signal through first and second delay elements before applying to the third output device; and
applying a release signal from the pull-up pre-driver components directly to the third output device;
passing said release signal through the second delay element before applying to the second output device; and
passing said release signal through the first and second delay elements before applying to the first output device.

39. The method of claim 38, wherein the output devices of the phased-output driver are transistors of differing sizes and wherein the step of triggering the output devices are performed to trigger the output devices in order from largest to smallest and wherein said steps of releasing the output devices are performed in order from smallest to largest.

40. The method of claim 38 further including the step of varying the delay provided by the delay elements.

41. The method of claim 40 further including the steps of disabling the delay elements and
selectively applying test signals to said output devices; and
detecting changes in the output line in response to the test signals.

42. The method of claim 38 the pull-down components or PMOS components and pull-up components are NMOS components.

* * * * *

UNITED STATES PATENT AND TRADEMARK OFFICE
CERTIFICATE OF CORRECTION

PATENT NO.   :   5,483,188
DATED        :   January 9, 1996
INVENTOR(S)  :   Tim Frodsham It is certified that error appears in the above-identified patent and that said Letters Patent is hereby corrected as shown below:

On the title page: Item [54] and Column 1, line 1, delete "GIL" and insert --GTL--

Column 1, line 1, delete "G1L" and insert --GTL--.

Column 12, line 29, delete "pull-down" and insert --pull-up--.
Column 16, line 51, insert --wherein-- following "38" and prior to "the".

Signed and Sealed this

Tenth Day of December, 1996

*Attest:*

BRUCE LEHMAN

*Attesting Officer*          Commissioner of Patents and Trademarks